United States Patent
Hsu et al.

(10) Patent No.: US 10,036,951 B2
(45) Date of Patent: Jul. 31, 2018

(54) PELLICLE ASSEMBLY AND FABRICATION METHODS THEREOF

(71) Applicant: Taiwan Semiconductor Manufacturing Company, Ltd., Hsin-Chu (TW)

(72) Inventors: Pei-Cheng Hsu, Taipei (TW); Chih-Cheng Lin, Kaohsiung (TW); Hsin-Chang Lee, Hsinchu County (TW); Ta-Cheng Lien, Hsinchu County (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 14/726,317

(22) Filed: May 29, 2015

(65) Prior Publication Data

US 2016/0349610 A1   Dec. 1, 2016

(51) Int. Cl.
*G03B 27/62* (2006.01)
*G03F 1/64* (2012.01)
*G03F 7/20* (2006.01)

(52) U.S. Cl.
CPC ............ *G03F 1/64* (2013.01); *G03F 7/70741* (2013.01)

(58) Field of Classification Search
CPC ................................ G03F 1/64; G03F 7/70741
See application file for complete search history.

(56) References Cited

U.S. PATENT DOCUMENTS

| | | | |
|---|---|---|---|
| 6,524,754 B2 * | 2/2003 | Eynon | G03F 1/62 430/5 |
| 6,744,562 B2 | 6/2004 | Okada et al. | |
| 6,822,731 B1 * | 11/2004 | Laganza | G03F 7/70983 355/53 |
| 8,192,899 B2 | 6/2012 | Nagata | |
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |

(Continued)

FOREIGN PATENT DOCUMENTS

| | | |
|---|---|---|
| CN | 1400627 A | 3/2003 |
| CN | 101788761 A | 7/2010 |

(Continued)

*Primary Examiner* — Deoram Persaud
(74) *Attorney, Agent, or Firm* — Hayes and Boone, LLP

(57) ABSTRACT

A method for fabricating a pellicle assembly for a lithography process includes fabricating a pellicle frame including a sidewall having a porous material. In some embodiments, the pellicle frame is subjected to an anodization process to form the porous material. The porous material includes a plurality of pore channels extending, in a direction perpendicular to an exterior surface of the sidewall, from the exterior surface to an interior surface of the sidewall. In various embodiments, a pellicle membrane is formed, and the pellicle membrane is attached to the pellicle frame such that the pellicle membrane is suspended by the pellicle frame. Some embodiments disclosed herein further provide a system including a membrane and a pellicle frame that secures the membrane across the pellicle frame. In some examples, a portion of the pellicle frame includes a porous material, where the porous material includes the plurality of pore channels.

18 Claims, 9 Drawing Sheets

(56) References Cited

U.S. PATENT DOCUMENTS

| | | | |
|---|---|---|---|
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 2004/0109153 A1* | 6/2004 | Vroman | G03F 1/64 355/75 |
| 2004/0135987 A1* | 7/2004 | Galburt | G03F 1/64 355/75 |
| 2005/0025959 A1* | 2/2005 | Bellman | C23C 14/48 428/336 |
| 2005/0074352 A1* | 4/2005 | Luo | G03F 1/64 417/572 |
| 2006/0119808 A1* | 6/2006 | Kate | G03F 1/64 355/30 |
| 2006/0246234 A1* | 11/2006 | Meyers | G03F 1/64 428/14 |
| 2012/0045714 A1* | 2/2012 | Akiyama | G03F 1/24 430/5 |
| 2012/0122025 A1* | 5/2012 | Murakami | G03F 1/64 430/5 |
| 2014/0202952 A1* | 7/2014 | Afzulpurkar | B01D 71/025 210/490 |
| 2015/0336301 A1 | 11/2015 | Kobrin et al. | |
| 2017/0003585 A1* | 1/2017 | Lin | G03F 1/64 |
| 2017/0176850 A1* | 6/2017 | Chen | G03F 1/22 |
| 2017/0351170 A1* | 12/2017 | Chen | G03F 7/20 |

FOREIGN PATENT DOCUMENTS

| | | |
|---|---|---|
| JP | H03166545 A | 7/1991 |
| JP | 2005017978 A | 1/2005 |
| TW | 201350554 A | 12/2013 |
| TW | 201409164 A | 3/2014 |

* cited by examiner

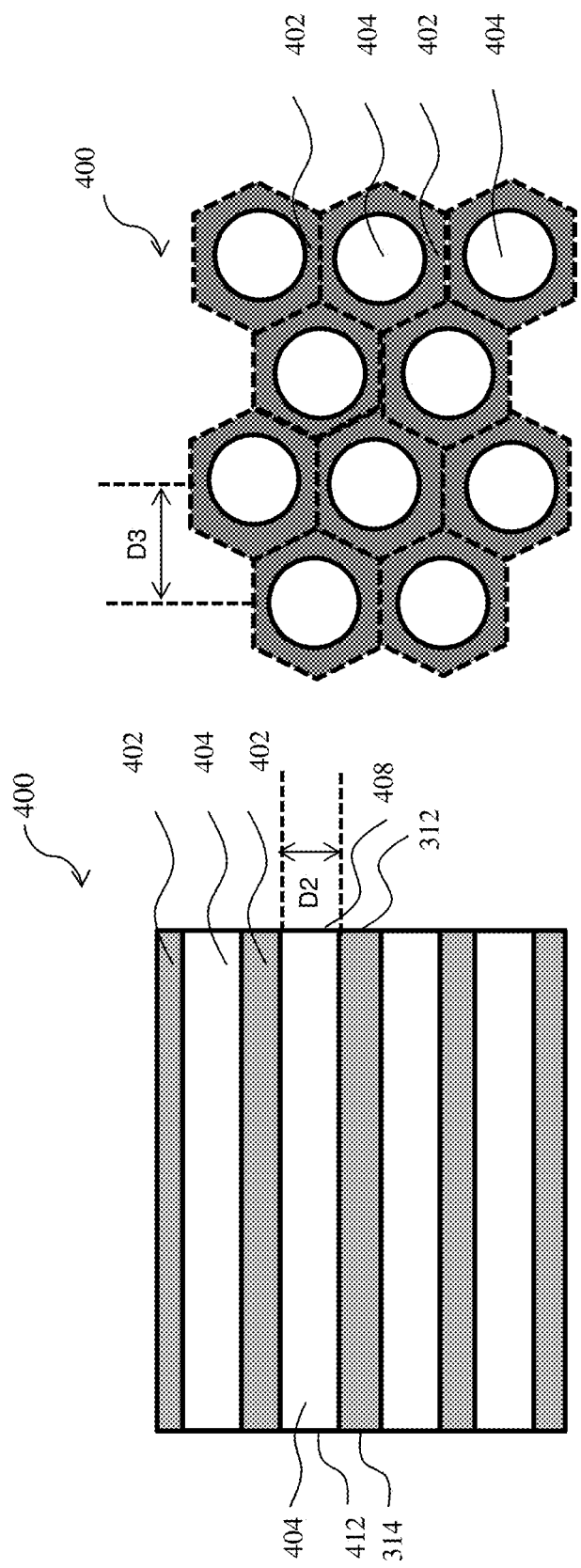

PELLICLE ASSEMBLY AND FABRICATION METHODS THEREOF

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle assembly, collectively referred to as a mask system. The pellicle assembly includes a transparent thin membrane and a pellicle frame, where the membrane is mounted over a pellicle frame. The pellicle protects the mask from fallen particles and keeps the particles out of focus so that they do not produce a patterned image, which may cause defects when the mask is being used. The membrane is typically stretched and mounted over the pellicle frame, and is attached to the pellicle frame by glue or other adhesives. An internal space may be formed by the mask, the membrane, and the pellicle frame. Deficiencies in balancing the pressure difference between the internal and external pressure may cause the membrane to become distorted, wrinkled, broken, or otherwise damaged, thereby rendering the mask pellicle system unusable. Thus, existing techniques for fabricating mask pellicle systems have not proved entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are partial sectional views of a pellicle frame, in accordance with some embodiments.

DETAILED DESCRIPTION

Figure 1:
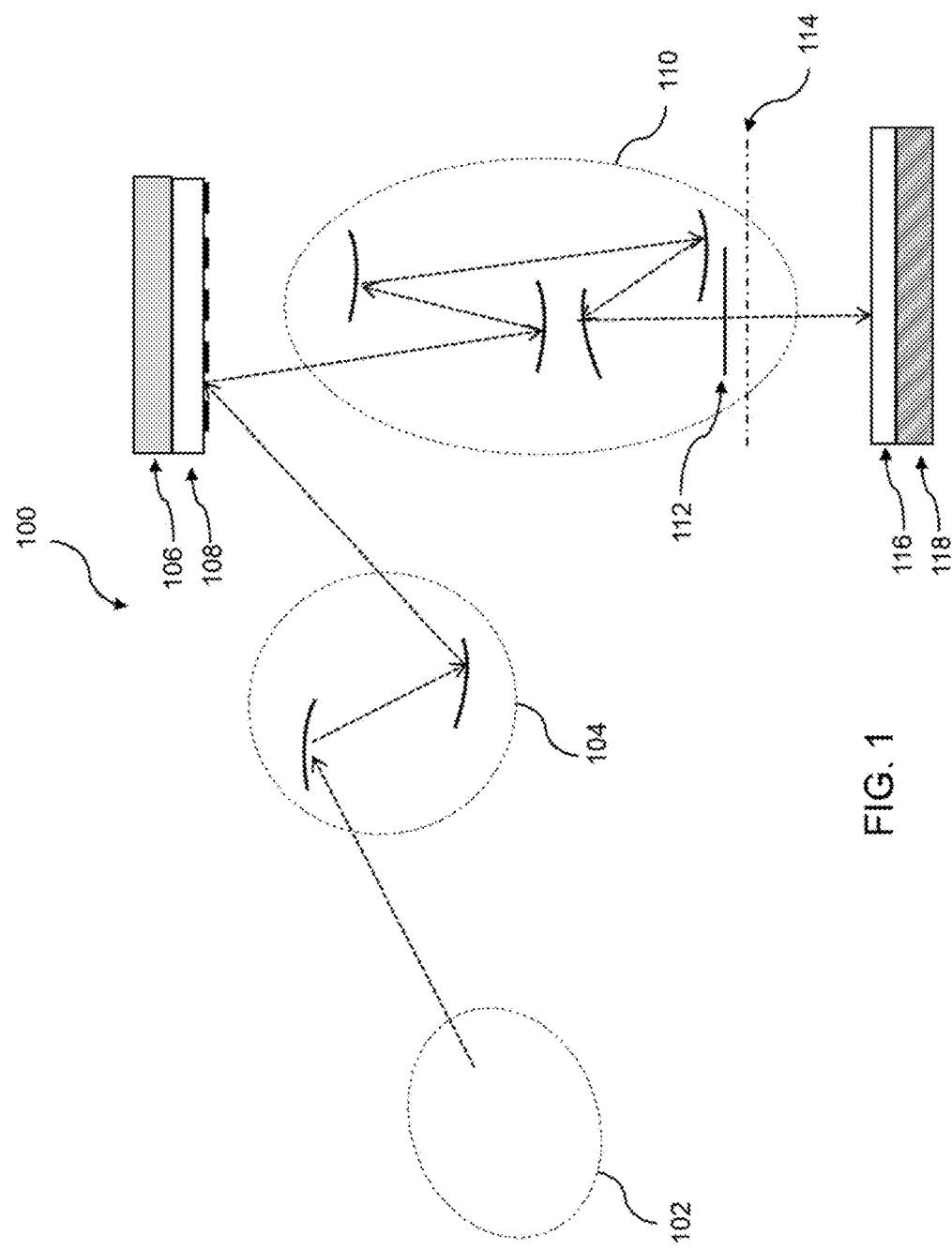
FIG. 1 is a schematic view of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm2. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

Figure 2:
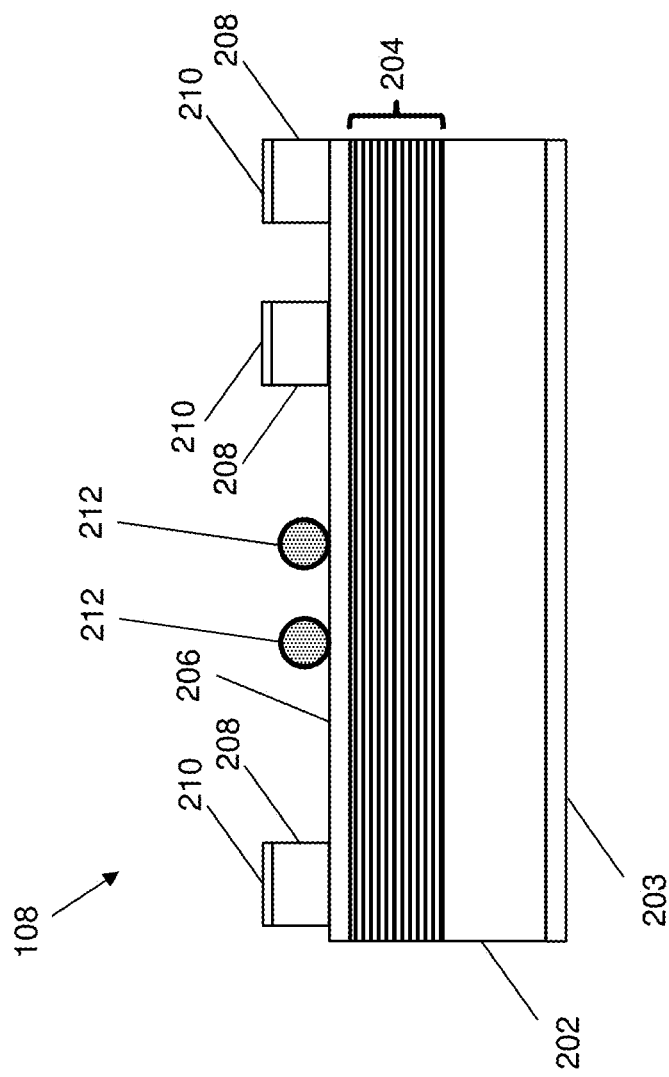
FIG. 2 is a cross-section of a mask, in accordance with some embodiments.

Returning to the mask 108, and with reference to the example of FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250—350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_2N_u$ layer, which may have a thickness of about 50-75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_2N_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may include a PSM which utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. As shown in FIG. 2, particles 212 may be unintentionally deposited on the surface of the capping layer 206 and can result in degradation of lithographically transferred patterns if not removed. Particles 212 may be introduced by any of a variety of methods such as during a chemical mechanical polishing (CMP) process, a cleaning process, and/or during handling of the EUV mask 108. While the particles 212 are illustrated as having a circular shape, it will be understood that other particle shapes and sizes are possible, and are intended to fall within the scope of the present disclosure.

Figure 3A:
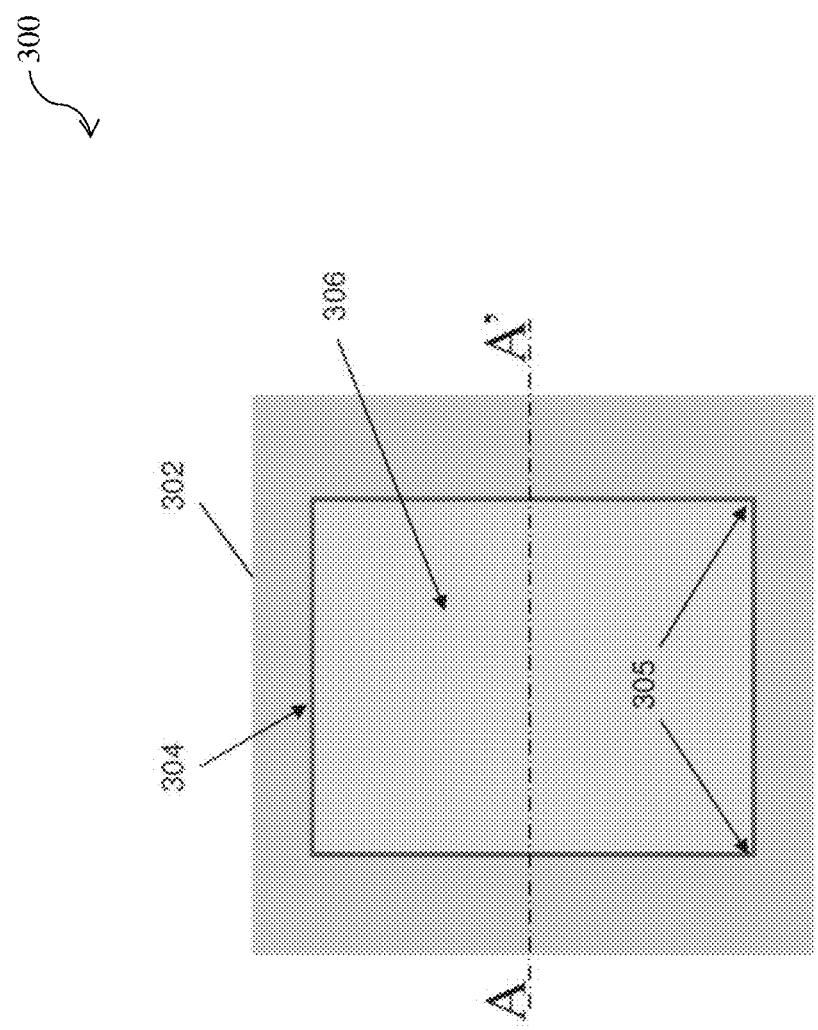
FIGS. 3A, 3B, and 3C are a top-view, a perspective view, and a cross-sectional view along line A-A', respectively, of a mask pellicle system, in accordance with some embodiments.
Figure 3B:
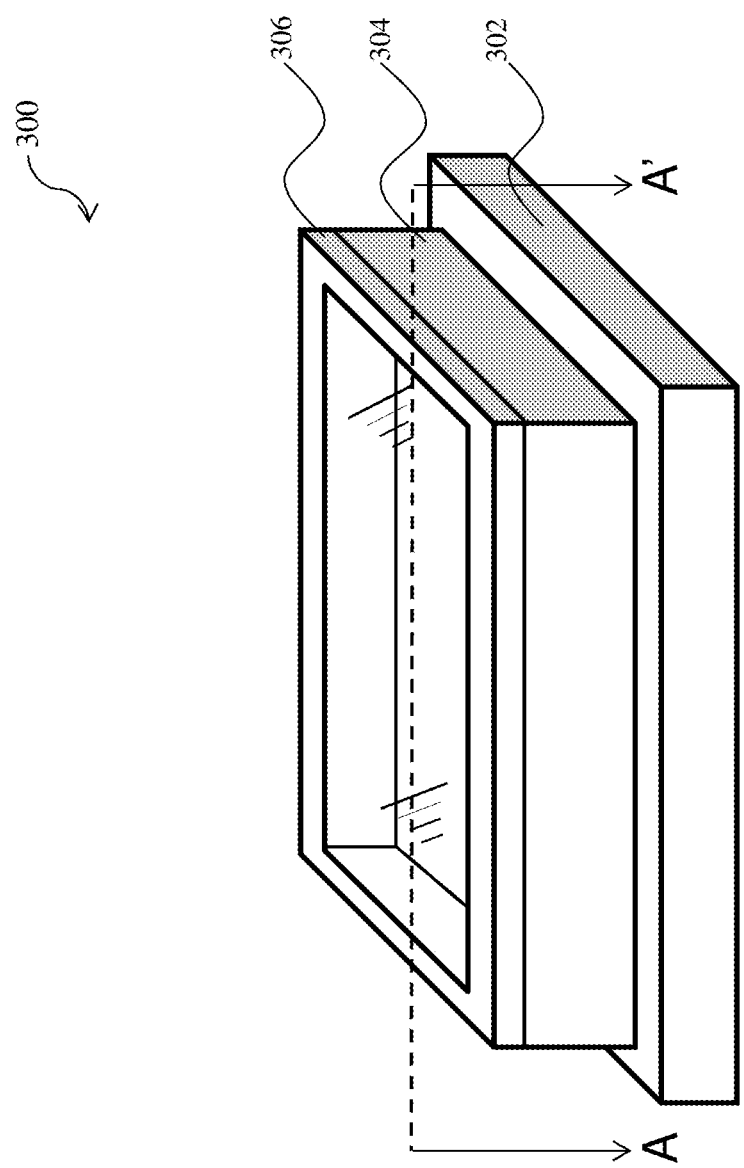
Figure 3C:
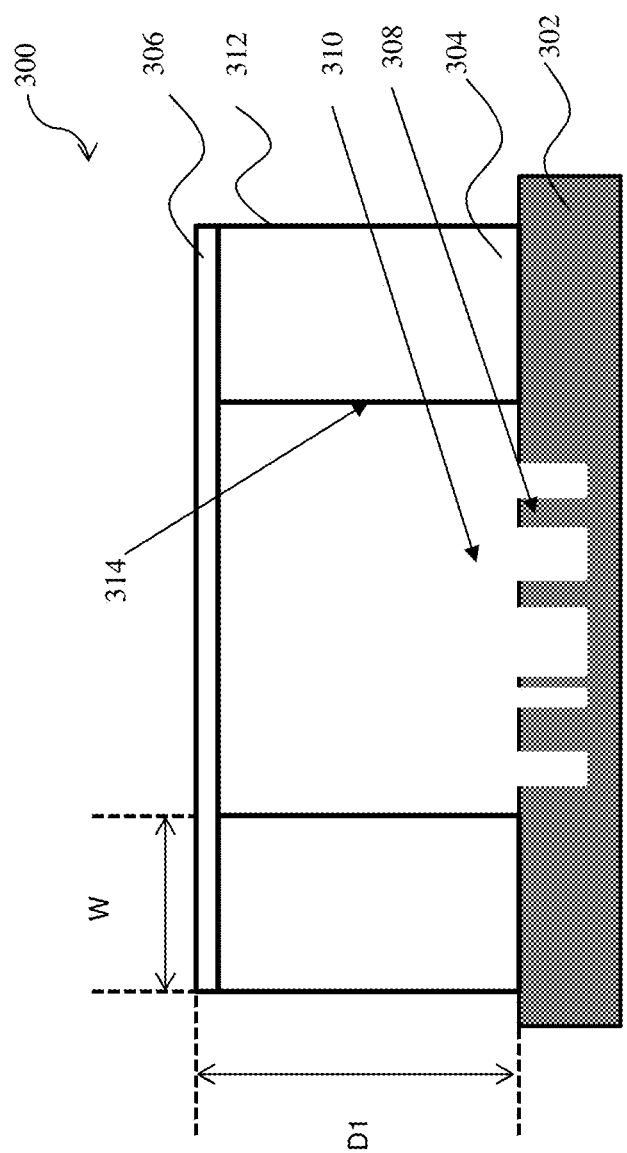

With reference to FIGS. 3A, 3B, and 3C, illustrated therein is a top-view, a perspective view, and a cross-sectional view along line A-A', respectively, of a mask pellicle system 300. Referring to FIGS. 3A, 3B, and 3C, the mask pellicle system 300 and a method of using the same are described.

The mask pellicle system 300 includes a membrane 306 configured proximate to the mask 302. The membrane 306 is made of a thin film transparent to the radiation beam used in a lithography patterning process. The membrane 306 is also configured proximate to a patterned surface 308 on the mask 302 as illustrated in FIG. 3C. The membrane 306 may include one or more materials including silicon, polymer, silicon nitride (SiN), polycrystalline silicon (poly-Si), silicon carbide (SiC), a SiN/poly-Si/SiN sandwich film stack, and/or a Si-based compound. For example, the membrane 306 for an ArF lithography system may include a polymer. In a further example, the membrane 306 may include other suitable materials such as a low-transmittance EUV material. As used herein, a "low-transmittance EUV material" may include a material having a low transmittance at EUV wavelengths.

The mask pellicle system 300 also includes a pellicle frame 304 configured such that the membrane 306 can be attached and secured to the pellicle frame 304. The pellicle frame 304 may be designed in various dimensions, shapes, and configurations. Among those and other alternatives, the pellicle frame 304 may have one single component or multiple components. The pellicle frame 304 includes a material with mechanical strength, and designed in a shape, dimensions, and a configuration so as to secure the membrane 306 properly across the pellicle frame 304. In some embodiments, the pellicle frame 304 may be entirely formed by a porous material. In some examples, the pellicle frame 304 may be uniformly continuous. A pellicle assembly may include a pellicle frame 304 and a membrane 306 attached to the pellicle frame 304.

The mask pellicle system 300 further includes a mask 302. As discussed above, the mask 302 may also include a patterned surface 308 used to pattern an image into a semiconductor substrate by a lithographic process. In some embodiments, the mask 302 may be substantially the same as the mask 108, discussed above. By way of example, as illustrated in FIG. 3C, the membrane 306 is suspended (e.g., by the pellicle frame 304) a standoff distance "D1" (e.g., a couple of millimeters) away from the patterned surface 308 of the mask 302, while remaining within an optical path between the patterned surface 308 and a wafer to be patterned, such that any particles which land on the membrane 306 (e.g., rather than on the patterned surface 308) are held away from a focal plane of the projection optics 110 and will thus not be imaged onto a target semiconductor wafer. Also as illustrated in FIG. 3C, a sidewall of the pellicle frame 304 may have a width of "W." By way of example, the greater the standoff distance D1 and/or the sidewall width W are, the greater the amount of light may be blocked. Therefore, the standoff distance D1 and the sidewall width W may be configured according to the particular radiation source used in various lithography systems. In one embodiment, a pellicle system for a 6×6 inch mask in an EUV lithography system has a standoff distance D1 of about 2.0 mm, and widths W of sidewalls of the pellicle frame 304 equal to or less than about 2.0 mm. In some embodiments, for example in an ArF lithography system, the standoff distance D1 may be about 3.1 mm, and the sidewall width W may be about 1.5 mm.

In various embodiments, the mask pellicle system 300 may include an internal space 310. Referring to FIG. 3C, a bottom surface of the membrane 306, a top surface of the mask 302, and interior surfaces 314 of the pellicle frame 304 form the internal space 310. The pellicle frame 304 also has exterior surfaces 312. A difference in pressures between the internal space 310 and the outside space surrounding the mask pellicle system 300 may cause the membrane 306 to become distorted, wrinkled, broken, or otherwise damaged, thereby rendering the mask pellicle system 300 unusable. In some embodiments, the pellicle frame 304 includes a porous material with multiple pore channels, which are configured to equalize the pressures between the internal space 310 and the outside space surrounding the mask pellicle system 300, as described below.

In some examples, the mask pellicle system 300 may further include an adhesive layer interposed between the membrane 306 and the pellicle frame 304 to bond them together. Additionally, in some cases, the mask pellicle system 300 may include another adhesive layer interposed between the pellicle frame 304 and the mask 302 to bond them together. In at least some embodiments, the pellicle assembly including the pellicle frame 304 and membrane 306 may be removable from the mask 302.

With reference to FIGS. 4A and 4B, illustrated therein are a cross-sectional view along line A-A' of a portion of sidewalls of the pellicle frame 304 and a side view of a portion of exterior surfaces 312 of sidewalls of the pellicle frame 304, respectively. In various embodiments, the pellicle frame 304 may include a porous material 400 constructed according to aspects of the present disclosure. By way of example, the porous material 400 may include anodized alumina oxide (AAO) and/or other suitable materials. In various embodiments, AAO may be formed using aluminum (Al) and/or an aluminum alloy. In some embodiments, the porous material 400 may be formed by a sintering method, and the material may include Al, Al-alloy, titanium (Ti), nickel (Ni), gold (Au), silver (Ag), copper (Cu), molybdenum (Mo), platinum (Pt), chromium (Cr), manganese (Mn), iron (Fe), cobalt (Co), palladium (Pd), tantalum (Ta), tungsten (W), and/or combinations thereof. While some examples of metals which may be used for the sintering method to form the porous material 400 have been given, one of ordinary skill in the art in possession of the present disclosure will appreciate that other suitable materials may equally be used without departing from the scope of the present disclosure.

Referring to FIG. 4A, the porous material 400 may include a plurality of pore channels 404. Each of the plurality of pore channels 404 extends from a first opening 408 on an exterior surface 312 of a sidewall of the pellicle frame 304 to a second opening 412 on an interior surface 314 of the sidewall, in a direction substantially perpendicular to the exterior surface 312. The first opening 408 has a diameter of "D2."

Figure 6:
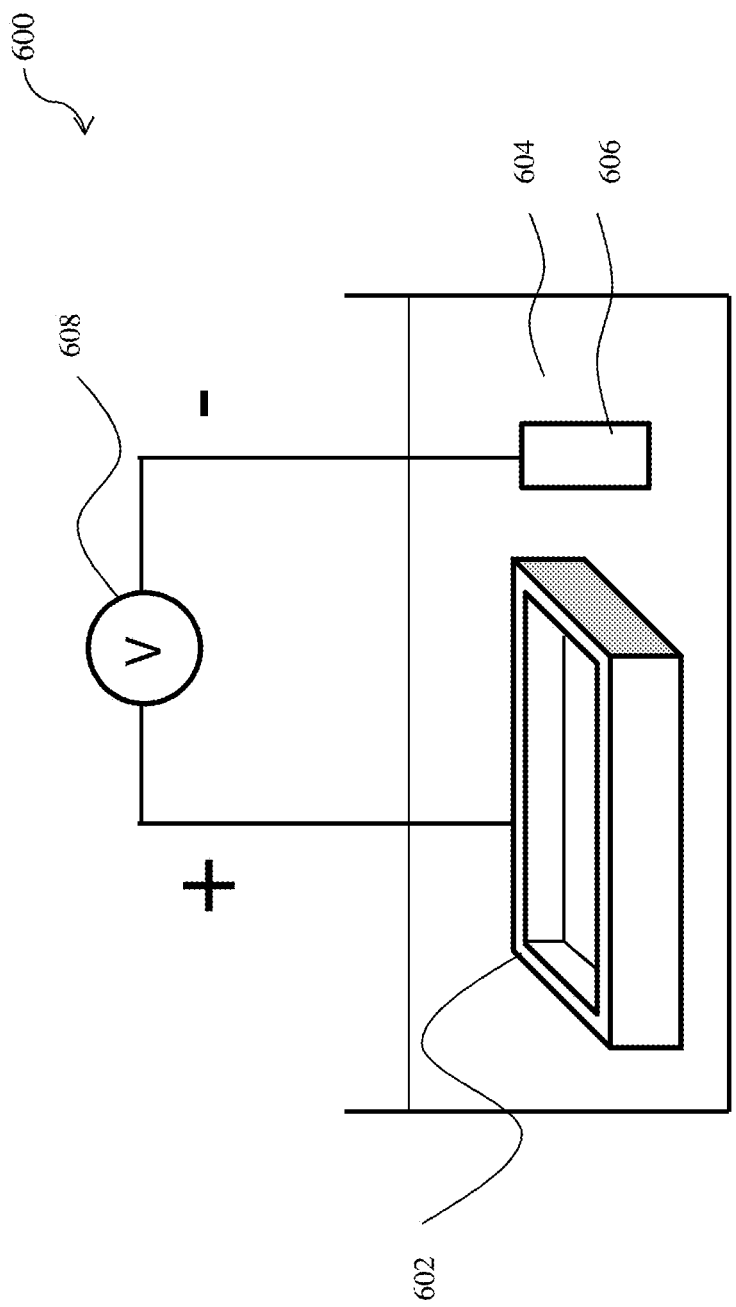
FIG. 6 is a schematic diagram of a system constructed in accordance with some embodiments.

Referring to FIG. 4B, the porous material 400 on the exterior surfaces 312 may form ordered porous structures. For example, as illustrated in FIG. 4B, the porous material 400 may form a self-ordered hexagonal pattern, which has an inter-pore distance of "D3", where the pores are round. As described herein, the "self-ordered" hexagonal pattern of the porous material 400 may refer to a self-ordering growth process using electrochemistry and based on an anodization process, as illustrated below with reference to FIG. 6. In various embodiments, such a self-ordering growth process may be used for the synthesis of highly ordered arrays of pores (e.g., pore channels 404) within the porous material 400. In some examples, the self-ordered hexagonal pattern formed in the porous material 400 includes a close-packed hexagonal pattern of pores, where the pore size (e.g., diameter 'D2'), inter-pore distance 'D3', and in some cases a length of the pore channels 404, may be controlled by tuning the anodization conditions. In some examples, the pores may include other shapes, for example, square, triangle, etc. In addition, in some examples, the porous material 400 may form other patterns, for example, a checkerboard pattern.

In various embodiments, the pore channels 404 are configured to equalize pressures between the internal space 310 and the space surrounding the mask pellicle system 300. Additionally, the pore channels 404 are configured to prevent particles from entering the internal space 310. Therefore, properties of the pore channels 404, including sizes and shapes of the pores, structures, density, inter-pore distances, orientation, and/or uniformity of the pore channels, may be configured in accordance with application requirements. For example, the diameters D2 of the first openings 408 may be configured to prevent particles from entering the pore channels 404. In at least some embodiments, the first openings 408 have diameters D2 that are in a range between about 10-1000 nm. Similarly, in various embodiments, the pore channels 404 and/or the second openings 412 have diameters D2 that are in a range between about 10-1000 nm. In some embodiments, the pore channels have inter-pore distances between about 25 nm and 500 nm. In some embodiments, the diameters D2 and/or inter-pore distances D3 may have a narrow distribution range. For example, the first openings, pore channels, and/or second openings may have diameters D2 of 50 nm±2 nm. In some examples, the pore channels may have inter-pore distances D3 of 200 nm±2 nm. In the various embodiments described herein, the pore geometry (size, shape, inter-pore distances, etc.) are configured to prevent particles from entering the internal space 310.

In various embodiments, properties of surface areas of the pellicle frame 304 covered by the porous material 400, including size, location, and shape, may be configured to achieve pressure equalization and contamination prevention. For example, exterior surfaces of sidewalls of the pellicle frame 304 covered by the porous material 400 used in an ArF lithography system may have a total surface area greater than 3.2 square millimeters (mm$^2$). In some examples, exterior surfaces of sidewalls of the pellicle frame 304 covered by the porous material 400 used in an EUV lithography system operating in a vacuum of about $2.8 \times 10^{-2}$ mbar may have a total surface area greater than about 320 square millimeters (mm$^2$).

Figure 5:
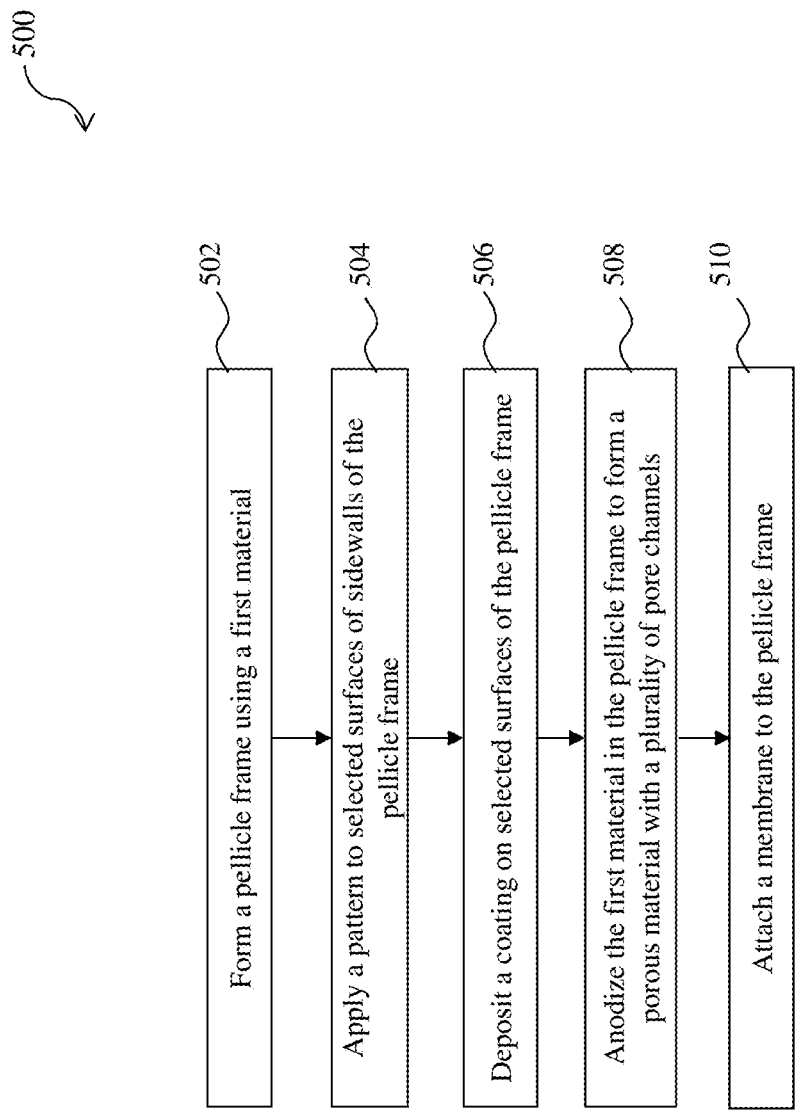
FIG. 5 is a flowchart of a method constructed in accordance with some embodiments.

Referring now to FIG. 5, illustrated is a flowchart of an embodiment of a method 500 used to fabricate a pellicle assembly. The method 500 may be used to fabricate a pellicle assembly such as the pellicle assemblies described above. It is understood that additional steps may be provided before, during, and after the method 500, and some of the steps described below can be replaced or eliminated, for additional embodiments of the method 500.

The method 500 begins at step 502, where a pellicle frame (e.g., the pellicle frame 304) is formed using a first material. The first material may be one or more of materials such as aluminum, aluminum alloy, titanium, niobium, titanium-niobium alloy, combinations thereof, and/or other suitable materials. The pellicle frame may be formed by processes including photolithography processing, wet chemical etching, and/or other suitable processes, and may be followed by an etchback or chemical mechanical polish (CMP) process. The first material may also include a suitable porous material with pore channels including AAO or porous materials formed by a sintering method, and no further processes may be necessary. For example, in some embodiments, the first material may include a uniformly continuous porous material, and the pellicle frame may be fabricated using the uniformly continuous porous material.

The method 500 then proceeds to step 504, where a pattern is applied to selected surfaces of the pellicle frame including the first material. For example, the pattern may be applied to selected exterior surfaces of sidewalls of the pellicle frame (e.g., the pellicle frame 304). The pattern may be applied using patterning processes such as imprinting by a dot-like stamp, imprinting by a pyramidal stamp, colloid sphere lithography, electron-beam lithography, focused-ion beam lithography, holographic lithography, argon (Ar) plasma etching, and/or direct writing laser (DWL) lithography. Specific patterns and/or specific patterning processes may be selected according to a material used as the first material, shapes of the pellicle frame, the scale of the required pore arrangement, the desired pattern, sizes and shapes of the pores, structures, density, inter-pore distances, orientation, and/or uniformity of the pore channels. For example, a pattern of an array of shallow depressions on exterior surfaces (e.g., the exterior surface 312) of sidewalls of the pellicle frame (e.g., the pellicle frame 304) may be formed by indentation. The pattern may serve as initiation sites to form the pore channels 404. Pores with different shapes, for example, circle, square, and/or triangle, may be produced according to the pattern. Pore channels may also be formed with various arrangements, for example, hexagonal arrangement and a mosaic check board pattern, according to the pattern. In various examples, the pattern and the patterning process may be selected to provide a desired configuration for the plurality of pore channels.

The method 500 then proceeds to step 506, where a coating is deposited on selected surfaces of the pellicle frame (e.g., the pellicle frame 304). The coating may include a material that is not anodizable, and helps to configure the pore channels 404. For example, a coating may be deposited on a top surface and a bottom surface of the pellicle frame 304, so that pore channels 404 may be formed on the sidewalls of the pellicle frame 304, and the pore channels extend in a direction substantially perpendicular to the exterior surfaces 312 of sidewalls of the pellicle frame 304.

The method 500 then proceeds to step 508, where the pellicle frame including the first material is anodized to form a porous material with a plurality of pore channels (e.g., the pore channels 404). Step 508 may be performed by using an anodizing system 600 shown in FIG. 6, which provides a schematic diagram that illustrates the anodizing system 600. According to an embodiment, the pellicle frame including a first material 602 is anodized to form a porous material with pore channels (e.g., the pore channels 404). The pellicle frame including the first material 602 is immersed in an electrolyte solution 604. The electrolyte solution 604 may include oxalic acid, phosphoric acid, sulfuric acid, combinations thereof, and/or other suitable materials. Other chemicals, such as moderators and/or additives, may be added to further control the anodization process. An HP 6002A DC Power Supply, or other suitable power supply, may be used as the voltage source 608. The pellicle frame including the first material 602 may serve as the anode. In various embodiments, the voltage source 608 provides a potential difference between the anode (e.g., the pellicle frame including the first material 602) and a cathode 606. Upon application of the potential difference, by way of the voltage source 608, an anodization process anodizes the first material of the pellicle frame 602 to form a porous material with a plurality of pore channels (e.g., the pore channels 404). The properties of the pore channels may be configured by adjusting one or more anodizing parameters including temperature, acidity, composition and/or concentration of the electrolyte solution, voltage, current, and/or duration of the anodization process. The properties of the plurality of pore channels include size, density, orientation, shape, length, and/or uniformity. The properties may also be affected by the first material used for the pellicle frame 602. In some embodiments, first material used for the pellicle frame 602 may include aluminum of various purities or an aluminum alloy. In some examples, a porous material AAO may be obtained by anodization of aluminum carried out under conditions of constant voltage 40V in a 0.4M oxalic acid solution at 0° C. for 7 hours. In some embodiments, AAO has a plurality of pore channels with diameters in an range of about 10-1000 nm. In some examples, a porous material AAO may be obtained by anodization of aluminum carried out under conditions of constant voltage 25V in a 2.3 M sulfuric solution at 10° C., and the AAO has a plurality of pore channels with diameters of about 15 nm. In some cases, a multi-step anodization process may be used to modulate the properties of pore channels, where anodizing parameters may be changed after each step. In some examples, a branched pore channels such as a Y-shaped pore channels may be fabricated by voltage reduction by a factor of by a factor of $1/\sqrt{n}$ after the first anodization step, where n is the number of branches. For another example, a highly ordered porous material may be achieved by using a two-step anodization approach. Using the first anodization step, a first porous layer is formed. The first porous layer may be removed using a removal process, for example, wet chemical etching, to form a pre-textured surface. A second anodization step is then performed to form a highly ordered porous material. Because of the removal of the first porous layer, the pellicle frame may have different dimensions after the anodization process.

A barrier layer may develop at the end of the pore channels during the anodization process. The barrier layer may be removed to form through-hole pore channels using various removal processes, including extending the anodizing duration, wet chemical etching, ion milling, and/or plasma etching. The removal processes may be configured to keep the pore channels.

Referring back to FIG. 5, the method 500 then proceeds to step 510, where a membrane (e.g., the membrane 306) is attached to the pellicle frame (e.g., the pellicle frame 304) with a porous material (e.g., the porous material 400) to form a pellicle assembly.

Figure 7:
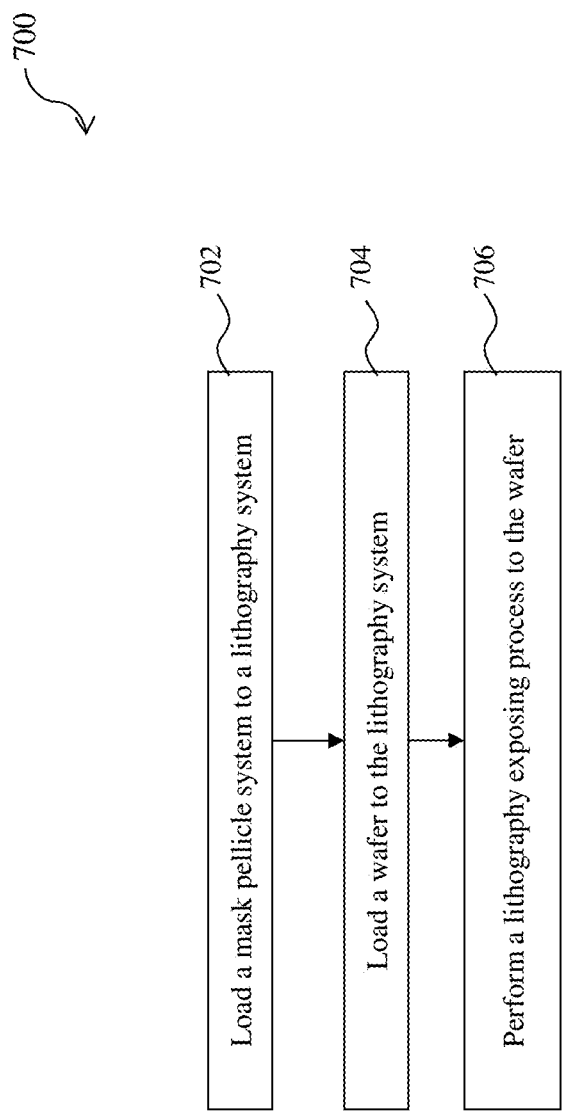
FIG. 7 is a flowchart of a method constructed in accordance with some embodiments.

Referring now to FIG. 7, illustrated is a flowchart of a method 700 used for performing a lithography process in an integrated circuit fabrication constructed according to aspects of the present disclosure in one or more embodiments. Referring to FIGS. 1, 3 and 7, the method 700 begins at step 702 by loading a mask pellicle system 300 to a lithography system 100. Step 702 in the method 700 may further include other steps, such as alignment after the mask pellicle system is secured on the mask stage 106.

The method 700 then proceeds to step 704, where a semiconductor wafer is loaded to the substrate stage 118 of the lithography system 100. In some examples, the semiconductor wafer may be a silicon wafer coated with a photoresist layer. The photoresist layer is to be patterned by a lithography exposure process, such that the pattern on the patterned surface 308 is transferred to the photoresist layer. The method 700 then proceeds to step 706, where a lithography exposure process transfers the pattern on the patterned surface 308 to the semiconductor wafer.

Additional steps can be provided before, during, and after the method 700, and some of the steps described can be replaced, eliminated, or moved around for additional embodiments of the method 700. In one example, the lithography process includes soft baking, mask aligning, exposing, post-exposure baking, developing photoresist, and hard baking.

Thus, the present disclosure provides a system for semiconductor lithography process, where the system includes a membrane and a pellicle frame of a porous material securing the membrane. The porous material includes a plurality of pore channels configured to filter particles and provide pressure equalization. In an embodiment, the pellicle frame is entirely formed by the porous material. In an embodiment, the pore channels have an ordered arrangement. Each of the plurality of pore channels extends from a first opening on an exterior surface of a sidewall of the pellicle frame to a second opening on an interior surface of the sidewall, in a direction substantially vertical to the exterior surface of the sidewall. In an embodiment, the system includes a mask. The mask includes a substrate and a predefined pattern formed on the substrate. The pellicle frame is mounted on the mask to form an internal space surround by the membrane, the mask, and interior surfaces of sidewalls of the pellicle frame. The pore channels prevent particles from entering the internal space, and provide pressure equalization between the internal space and the space surrounding the system. In an embodiment, the pellicle frame is uniformly continuous. In an embodiment, the porous material is anodized alumina oxide (AAO). In an embodiment, the first openings on exterior sidewalls of the pellicle frame have diameters that are in a range between about 10-1000 nm. Similarly, in various embodiments, the pore channels and/or the second openings have diameters that are in a range between about 10-1000 nm. In an embodiment, exterior sidewalls of the pellicle frame covered by the porous material have a total surface area greater than 320 square millimeters ($mm^2$).

The present disclosure also provides a method for fabricating a mask pellicle system for a lithography process. The method includes forming a pellicle frame of a porous material and attaching a membrane to the pellicle frame. The porous material includes a plurality of pore channels configured to filter particles and equalize pressure. In an embodiment, forming the pellicle frame includes forming the pellicle frame using a first material and performing an anodization process to the pellicle frame of the first frame in an electrolyte solution. The first material is anodized to form the porous material. In an embodiment, performing the anodization process includes applying a pattern to selected surfaces of sidewalls of the pellicle frame of the first material using a patterning process. The pattern and the patterning process are selected to configure the plurality of pore channels. In an embodiment, performing the anodization process includes configuring properties of the plurality of pore channels by adjusting one or more anodizing parameters including temperature, acidity, composition and/or concentration of the electrolyte solution, voltage, current, and/or duration of the anodization process, wherein the properties of the plurality of pore channels include size, inter-pore distance, orientation, shape, and/or uniformity. In an embodiment, performing the anodization process includes depositing a coating on a top surface of the pellicle frame of the first material and a bottom surface of the pellicle frame of the first material to configure orientation of the plurality of pore channels. In an embodiment, the first material is selected from a group of aluminum, aluminum alloy, and a combination thereof. In an embodiment, a method for fabricating a mask pellicle system for a lithography process includes etching a silicon wafer to form the membrane.

A method for a lithography process is also provided. The method includes loading a mask pellicle system to a lithography system, loading a wafer to the lithography system, and performing a lithography exposure process to the wafer with the mask by the lithography system. The mask pellicle system includes a mask, which includes a substrate and a predefined pattern formed on the substrate. The mask pellicle also includes a membrane, a pellicle frame of a porous material securing the membrane. The porous material including a plurality of pore channels configured to filter particles and provide pressure equalization. The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A system for a semiconductor lithography process, comprising:
a membrane;
a pellicle frame that secures the membrane across the pellicle frame, wherein the pellicle frame is entirely formed of a uniformly continuous porous material; and a mask including a patterned surface, wherein the uniformly continuous porous material is directly bonded to the mask by way of an adhesive layer interposed between the uniformly continuous porous material and the mask, and wherein the membrane is suspended a standoff distance away from the patterned surface;

wherein the uniformly continuous porous material includes a plurality of pore channels extending, in a direction perpendicular to an exterior surface of the pellicle frame, from the exterior surface to an interior surface of the pellicle frame.

2. The system of claim 1, wherein the plurality of pore channels form an ordered arrangement, and wherein each of the plurality of pore channels extends from a first opening on the exterior surface of the pellicle frame to a second opening on the interior surface of the pellicle frame.

3. The system of claim 2, wherein the first openings on the exterior surface of the pellicle frame has a diameter in a range between about 10-1000 nm.

4. The system of claim 1, wherein an internal space is defined by a bottom surface of the membrane, a top surface of the mask, and the interior surface of the pellicle frame.

5. The system of claim 1, wherein the plurality of pore channels are configured to prevent particles from entering the internal space, and wherein the plurality of pore channels are configured to provide pressure equalization between the internal space and a space surrounding the system.

6. The system of claim 1, wherein the uniformly continuous porous material includes anodized alumina oxide (AAO).

7. The system of claim 1, wherein the system serves as part of an extreme ultraviolet (EUV) lithography system.

8. A method for fabricating a pellicle assembly for a lithography process, comprising:
fabricating a pellicle frame including a sidewall, wherein the pellicle frame is entirely formed of a uniformly continuous porous material, and wherein the uniformly continuous porous material includes a plurality of pore channels extending, in a direction perpendicular to an exterior surface of the sidewall, from the exterior surface to an interior surface of the sidewall;
forming a pellicle membrane using a low-transmittance material;
attaching the pellicle membrane to the pellicle frame such that the pellicle membrane is suspended by the pellicle frame; and
directly bonding the uniformly continuous porous material to a mask by way of an adhesive layer interposed between the uniformly continuous porous material and the mask.

9. The method of claim 8, wherein the fabricating a pellicle frame further comprises:
forming a pattern on a surface of the sidewall, wherein the pattern serves as initiation sites for formation of the pore channels;
immersing the pellicle frame in an electrolyte solution and applying a potential difference between the pellicle frame and a cathode;
responsive to applying the potential difference, performing an anodization process of the pellicle frame, the sidewall of the pellicle frame is anodized to form the uniformly continuous porous material including the plurality of pore channels, wherein the plurality of pore channels have an ordered structure, wherein each of the plurality of pore channels extends from a first opening on an exterior surface of the sidewall of the pellicle frame to a second opening on an interior surface of the sidewall.

10. The method of claim 9, wherein the pattern formed on the surface of the sidewall is formed using a patterning process selected to provide a desired configuration for the plurality of pore channels.

11. The method of claim 10, wherein the patterning process includes at least one selected from imprinting by a dot-like stamp, imprinting by a pyramidal stamp, colloid sphere lithography, electron-beam lithography, focused-ion beam lithography, holographic lithography, argon (Ar) plasma etching, and direct writing laser (DWL) lithography.

12. The method of claim 9, wherein the performing the anodization process further includes configuring a property of the plurality of pore channels by adjusting at least one anodizing parameter selected from a group including temperature of the electrolyte solution, acidity of the electrolyte solution, composition of the electrolyte solution, concentration of the electrolyte solution, voltage, current, and duration of the anodization process.

13. The method of claim 9, wherein the performing the anodization process further includes depositing a coating on a top surface of the pellicle frame and a bottom surface of the pellicle frame, wherein the coating includes a non-anodizable materials, and wherein the coating serves to form the plurality of pore channels on the sidewall of the pellicle frame.

14. The method of claim 9, wherein the pellicle frame includes a material selected from a group including aluminum, aluminum alloy, titanium, niobium, a titanium-niobium alloy, and a combination thereof.

15. The method of claim 9, wherein the first opening has diameter in a range between about 10-1000 nm.

16. The method of claim 8, wherein the membrane includes a material selected from silicon, silicon nitride (SiN), polycrystalline silicon (poly-Si), silicon carbide (SiC), a Si-based compound, and a polymer.

17. A method for a lithography process, comprising:
providing a pellicle apparatus, wherein the pellicle apparatus includes a membrane and a pellicle frame that secures the membrane across the pellicle frame, and wherein the pellicle frame is entirely formed of a uniformly continuous porous material having a plurality of pore channels extending, in a direction perpendicular to an exterior surface of the pellicle frame, from the exterior surface to an interior surface of the pellicle frame;
mounting the pellicle apparatus onto a mask, wherein the mask includes a patterned surface, and wherein the uniformly continuous porous material is directly bonded to the mask by way of an adhesive layer interposed between the uniformly continuous porous material and the mask;
loading the mask having the pellicle apparatus mounted thereupon into a lithography system and loading a semiconductor wafer onto a substrate stage of the lithography system; and
performing a lithography exposure process to transfer a pattern of the patterned surface from the mask to the semiconductor wafer.

18. The method of claim 17, wherein an internal space is defined by a bottom surface of the membrane, a top surface of the mask, and the interior surface of the pellicle frame, wherein the plurality of pore channels are configured to prevent particles from entering the internal space, and wherein the plurality of pore channels provide pressure equalization between the internal space and a space surrounding the pellicle apparatus while the pellicle apparatus is loaded within the lithography system.

* * * * *